(12) United States Patent
Pan

(10) Patent No.: US 7,956,370 B2
(45) Date of Patent: Jun. 7, 2011

(54) SILICON BASED SOLID STATE LIGHTING

(75) Inventor: Shaoher X. Pan, San Jose, CA (US)

(73) Assignee: SiPhoton, Inc., San Jose, CA (US)

( * ) Notice: Subject to any disclaimer, the term of this patent is extended or adjusted under 35 U.S.C. 154(b) by 293 days.

(21) Appl. No.: 11/761,446

(22) Filed: Jun. 12, 2007

(65) Prior Publication Data

US 2008/0308835 A1 Dec. 18, 2008

(51) Int. Cl.
*H01L 29/22* (2006.01)
*H01L 29/24* (2006.01)

(52) U.S. Cl. .............................. 257/95; 257/14; 257/103

(58) Field of Classification Search .................. 257/13, 257/14, 94, 95, 103, E33.003, E33.005, E33.006, 257/E33.007, E33.008, E33.023, E33.025
See application file for complete search history.

(56) References Cited

U.S. PATENT DOCUMENTS

| | | | |
|---|---|---|---|
| 5,793,062 A * | 8/1998 | Kish et al. ..................... | 257/98 |
| 5,838,029 A | 11/1998 | Shakuda | |
| 6,233,265 B1 | 5/2001 | Bour | |
| 6,345,063 B1 * | 2/2002 | Bour et al. .................. | 372/45.01 |
| 6,844,569 B1 | 1/2005 | Lee et al. | |
| 6,881,981 B2 | 4/2005 | Tsuda et al. | |
| 6,936,851 B2 | 8/2005 | Wang | |
| 2004/0113166 A1 | 6/2004 | Tadatomo et al. | |
| 2005/0199891 A1 | 9/2005 | Kunisato et al. | |
| 2008/0179611 A1 | 7/2008 | Chitnis et al. | |
| 2008/0251808 A1 | 10/2008 | Kususe et al. | |

FOREIGN PATENT DOCUMENTS

| | | |
|---|---|---|
| JP | 2006-045648 | 2/1994 |
| JP | 2005328073 A | 11/2005 |
| KR | 20030074824 A | 4/2005 |
| KR | 100649769 B1 | 11/2006 |
| KR | 100705226 B1 | 4/2007 |

OTHER PUBLICATIONS

Co-pending U.S. Appl. No. 12/177,114, filed Jul. 21, 2008.
Co-pending U.S. Appl. No. 12/537,102, filed Aug. 6, 2009.
International Search Report PCT/US2008/008868 dated Apr. 15, 2009, pp. 1-4.
International Search Report PCT/US2008/068067 dated Feb. 26, 2010, pp. 1-3.
Written Opinion PCT/US2008/008868 dated Apr. 15, 2009, pp. 1-6.
Written Opinion PCT/US2008/068067 dated Feb. 26, 2010, pp. 1-5.
Co-pending U.S. Appl. No. 12/767,577, flied Apr. 26, 2010.
Co-pending U.S. Appl. No. 12/480,463, flied Jun. 8, 2009.
USPTO, Non-Final Office Action in U.S. Appl. No. 12/537,102, mailed Dec. 15, 2010, 17 pages.
Fish & Richardson, Response to Non-Final Office Action in U.S. Appl. No. 12/537,102, mailed Jan. 14, 2011, 7 pages.
Authorized officer Young Bae Lee, International Search Report and Written Opinion in PCT/US2010/035020, mailed Dec. 17, 2010, 14 pages.
Authorized officer Simin Baharlou, International Preliminary Report on Patentability in PCT/US2008/068067, mailed Jan. 13, 2011, 7 pages.
Authorized officer Simin Baharlou, International Preliminary Report on Patentability in PCT/US2008/008868, mailed Feb. 3, 2011, 8 pages.

* cited by examiner

*Primary Examiner* — Hung Vu
(74) *Attorney, Agent, or Firm* — Fish & Richardson P.C.

(57) ABSTRACT

A semiconductor device includes a substrate comprising a first surface having a [111] orientation and a second surface having a second orientation and a plurality of III-V nitride layers on the substrate, wherein the plurality of III-V nitride layers are configured to emit light when an electric current is produced in one or more of the plurality of III-V nitride layers.

22 Claims, 18 Drawing Sheets

US 7,956,370 B2

SILICON BASED SOLID STATE LIGHTING

BACKGROUND

The present patent application is related to solid-state lighting devices.

Solid-state light sources, such as light emitting diodes (LEDs) and laser diodes, can offer significant advantages over other forms of lighting, such as incandescent or fluorescent lighting. For example, when LEDs or laser diodes are placed in arrays of red, green and blue elements, they can act as a source for white light or as a multi-colored display. In such configurations, solid-state light sources are generally more efficient and produce less heat than traditional incandescent or fluorescent lights. Although solid-state lighting offers certain advantages, conventional semiconductor structures and devices used for solid-state lighting are relatively expensive. One of the costs related to conventional solid-state lighting devices is related to the relatively low manufacturing throughput of the conventional solid-state lighting devices.

Referring to FIG. 1, a conventional LED structure 100 includes a substrate 105, which may, for example, be formed of sapphire, silicon carbide, or spinel. A buffer layer 110 is formed on the substrate 105. The buffer layer 110, also known as nucleation layer, serves primarily as a wetting layer, to promote smooth, uniform coverage of the sapphire substrate. The buffer layer 110 is typically formed of GaN, InGaN, AlN or AlGaN and has a thickness of about 100-500Angstroms. The buffer layer 110 is typically deposited as a thin amorphous layer using Metal Organic Chemical Vapor Deposition (MOCVD).

A p-doped group III-V nitride layer 120 is then formed on the buffer layer 110. The p-doped group III-V nitride layer 120 is typically GaN. An InGaN quantum-well layer 130 is formed on the p-doped group III-V nitride layer 120. An active group III-V nitride layer 140 is then formed on the InGaN quantum-well layer 130. An n-doped group III-V nitride layer 150 is formed on the group III-V layer 140. The p-doped group III-V nitride layer 120 is n-type doped. A p-electrode 160 is formed on the n-doped group III-V nitride layer 150. An n-electrode 170 is formed on the first group III-V nitride layer 120.

One drawback of the above described convention LED structure 100 is the low manufacturing throughput associated with the small substrate dimensions. For example, sapphire or silicon carbide substrates are typically supplied in diameters of 2 to 4 inches. Another drawback of the above described convention LED structure 100 is that the suitable substrates such as sapphire or silicon carbide are typically not provided in single crystalline forms. The p-doped group III-V nitride layer 120 can suffer from cracking due to lattice mismatch even with the assistance of the buffer layer 110. The p-doped group III-V nitride layer 120 can suffer from cracking or delamination due to different thermal expansions between the p-doped group III-V nitride layer and the substrate. As a result, light emitting performance of the LED structure 100 can be compromised.

Accordingly, there is therefore a need for a semiconductor structure and/or device that provides solid-state lighting using simpler processes and at reduced cost.

SUMMARY OF THE INVENTION

In one aspect the present invention relates to a semiconductor device including a substrate comprising a first surface having a first orientation and a second surface having a second orientation: and a plurality of III-V nitride layers on the substrate, wherein the plurality of III-V nitride layers are configured to emit light when an electric current is produced in one or more of the plurality of III-V nitride layers.

In one aspect, the present invention relates to a semiconductor device including a silicon substrate comprising a (100) upper surface and a V-shaped trench having a (111) trench surface; a lower III-V nitride layer on the (100) upper surface and the (111) trench surface; a quantum-well layer on the lower III-V nitride layer, wherein the quantum-well layer is configured to emit light when an electric current is produced in the quantum-well layer; and an upper III-V nitride layer on the quantum well layer.

In another aspect the present invention relates to a method for fabricating a semiconductor device. The method includes forming a trench having a first surface in a substrate having a second surface, wherein the first surface has a first orientation and the second surface has a second orientation; forming one or more buffer layers on the first surface and the second surface; forming a lower III-V nitride layer on the buffer layer; forming a quantum-well layer on the lower III-V nitride layer, wherein the quantum-well layer is configured to emit light when an electric current is produced in the quantum-well layer; and forming an upper III-V nitride layer on the quantum-well layer.

Implementations of the system may include one or more of the following. The substrate can include silicon, glass, silicone oxide, sapphire, or stainless steel. The semiconductor device can he alight emitting diode (LED) or a laser diode. The substrate can include a V-shaped or a U-shaped trench. The substrate can include silicon, and wherein the first orientation is along the (100) crystal plane direction and the second orientation is along a (111) crystal plane direction. The semiconductor device can further include one or more buffer layers on the first surface, or the second surface, or both the first surface and the second surface, and below the a plurality of III-V nitride layers, wherein the one or more buffer layers are configured to reduce lattice mismatch between the substrate and at least one of the plurality of III-V nitride layers. The one or more buffer layers can include a material selected from the group consisting of GaN, ZnO, AlN, HfN, AlAs, SiCN, TaN, and SiC. At least one of the one or more buffer layers can have a thickness in the range of 1 to 1000 Angstroms. The plurality of III-V nitride layers can include a lower III-V nitride layer on the buffer layer; a quantum-well layer on the lower III-V nitride layer, wherein the quantum-well layer is configured to emit light when an electric current is produced in the quantum-well layer; and an upper III-V nitride layer on the quantum well layer. The lower III-V nitride layer can be formed of n-doped GaN and the upper III-V nitride layer is formed of p-doped GaN. The lower III-V nitride layer can be formed of p-doped GaN and the upper III-V nitride layer is formed of n-doped GaN. The quantum-well layer can include a layer formed by a material selected from the group of InN, and InGaN. The quantum-well layer can include a layer formed by a material selected from the group of GaN and AlGaN. The semiconductor device can further include a lower electrode on the lower III-V nitride layer; and an upper electrode on the upper III-V nitride layer. The upper electrode can include a transparent electrically conductive material. The upper electrode can include indium-tin-oxide (ITO), Au, Ni, Al, or Ti.

An advantage associated with the disclosed LED structures and fabrication processes can overcome lattice mismatch between the group III-V layer and the substrate and prevent associated layer cracking in conventional LED structures. The disclosed LED structures and fabrication processes can also prevent cracking or delamination in the p-doped or n-doped group III-V nitride layer caused by different thermal expansions between the p-doped group III-V nitride layer and the substrate. An advantage associated with the disclosed LED structures is that LED structures can significantly increase light emission efficiency by increasing densities of the LED structures and by additional light emissions from the sloped or vertical surfaces in the trenches.

Another advantage associated with the disclosed LED structures and fabrication processes is that the disclosed LED structures can be fabricated using existing commercial semiconductor processing equipment such as ALD and MOCVD systems. The disclosed LED fabrication processes can thus be more efficient in cost and time that some conventional LED structures that need customized fabrication equipments. The disclosed LED fabrication processes are also more suitable for high-volume semiconductor lighting device manufacture. Silicon wafers or glass substrates can be used to produce solid state LEDs. Manufacturing throughput can be much improved since silicon wafer can be provided in much larger dimensions (e.g. 6 to 12 inch silicon wafers) compared to the substrates used in the conventional LED structures. Furthermore, the silicon-based substrate can also allow driving and control circuit to be fabricated in the substrate. The LED device can thus be made more integrated and compact than conventional LED devices.

Yet another advantage of the disclosed LED structures and fabrication processes is that a transparent conductive layer can be formed on the upper III-V nitride layer of the LED structures to increase electric contact between the upper electrode and the upper Group III-V layer, and at the same time, maximizing light emission intensity from the upper surfaces of the LED structures.

Embodiments may include one or more of the following advantages. The disclosed lighting device and related fabrication processes can provide light devices at higher manufacturing throughput and thus manufacturing cost compared to the conventional light devices. The disclosed lighting device and related fabrication processes can also provide more integrated light devices that can include light emitting element, a driver, power supply, and light modulation unit integrated on a single semiconductor substrate.

BRIEF DESCRIPTION OF THE DRAWINGS

The following drawings, which are incorporated in and from a part of the specification, illustrate embodiments of the present invention and, together with the description, serve to explain fee principles of the invention.

DESCRIPTION OF THE INVENTION

Figure 2:
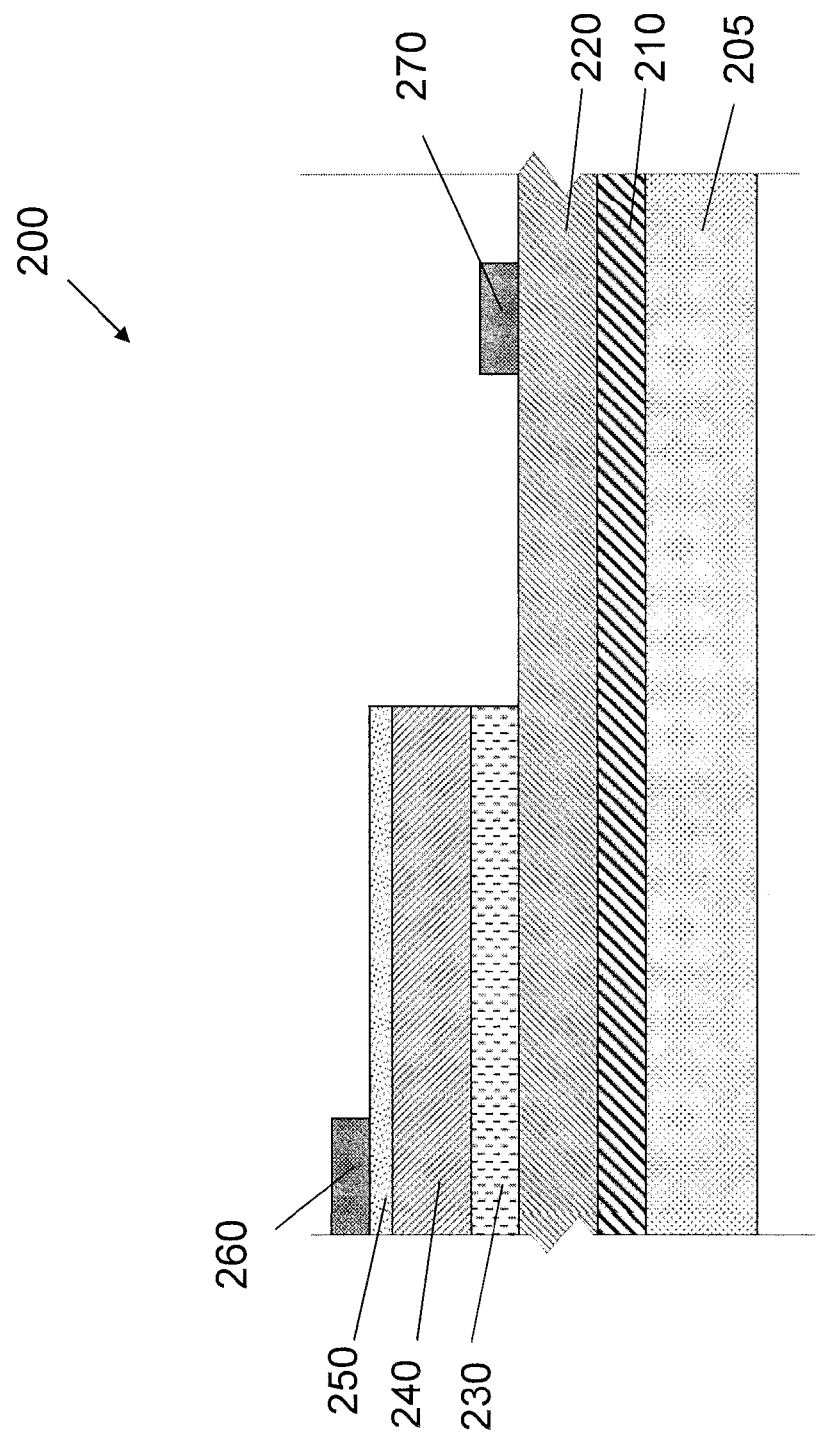
FIG. 2 is a cross-sectional view of a silicon-based LED structure in accordance with the present application.

Referring to FIG. 2, a LED structure 200 includes a substrate 205, which can have an upper surface in the (111) or a (100) crystalline direction. The substrate 205 can be formed of silicon, silicon oxide, or glass. For a silicon substrate, the substrate 205 can include a (100) or (111) upper surface. The substrate 205 can also include a complimentary metal oxide semiconductor (CMOS) material that includes an electric circuitry for driving and controlling the LED structure 200. A buffer layer 210 is formed on the substrate 205. The buffer layer 210 can be formed of GaN, ZnO, AlN, HfN, AlAs, TaN, or SiC. As described below in more details in conjunction with FIG. 6, the buffer layer 210 is deposited on die substrate 205 using atomic laser deposition (ALD) in a vacuum chamber maintained at a temperature in the range of 450C to 750C, such as about 600C. The buffer layer 210 can have a thickness of about 1 to 1000Angstroms such as 10 to 100 Angstroms. The buffer layer 210 can wet and form a uniform layer on the substrate 205. The buffer layer 210 can also have crystal structures with lattices epitaxially matched to the substrate 205 and the lower group III-V nitride layer 220.

A lower group III-V nitride layer 220 is then formed on the buffer layer 210. The lower group III-V nitride layer 220 is typically formed by n-doped GaN. A quantum-well layer 230 is formed on the group III-V nitride layer 220. In the present specification, the term "quantum well" refers to a potential well that confines charge carriers or charged particles such as electrons and holes to a two-dimensional planar region. In a semiconductor light emitting device, the quantum well can trap excited electrons and holes and define the wavelength of light emission when the electrons and the holes recombine in the quantum well and produce photons.

In the present specification, a quantum-well layer can include a uniform layer or a plurality of quantum wells. For example, a quantum-well layer (e.g. 230, 430, and 630) can include a substantially uniform layer made of InN, GaN, or InGaN. A quantum-well layer can also include a multi-layer structure defining one or more quantum wells. A quantum well can for example be formed by an InGaN layer sandwiched in between two GaN layers. A quantum well can also be formed by an InGaN layer sandwiched in between GaN or AlGaN layers. The quantum-well layer (e.g. 230, 430, and 630) can include one or a stack of such layered structure each defining a quantum well as described above.

The bandgap for InN is about 1.9 eV which is lower than the bandgap for GaN that is at about 3.4 eV. The lower bandgap of the InN or the InGaN layer can define a potential well for trapping charge carriers such as electrons and holes. The trapped electrons and holes can recombine to produce photons (light emission). The bandgap in the InN or the InGaN layer can therefore determine the colors of the light emissions. In other words, the colors of light emissions can be tuned by adjusting the compositions of In and Ga in InGaN. For example, a quantum well can produce rod light emission from an InN layer, green light emission from an In(0.5)Ga(0.5)N layer, and blue light emission from an In(0.3)Ga(0.7)N in the quantum-well.

An upper group III-V nitride layer 240 is then formed on the quantum-well layer 230. The upper group III-V nitride layer 240 can be formed by p-type doped GaN such as $Al_{0.1}Ga_{0.9}N$. The quantum-well layer 230 can include one or more quantum wells between the lower group III-V nitride Saver 220 and the upper group III-V nitride layer 240. A conductive layer 250 can optionally formed on the upper group III-V nitride layer 240. The conductive layer 250 can be made of indium-tin oxide (ITO) or a thin layer p-type ohmic metal. An upper electrode 260 is formed on the conductive layer 250. The upper electrode 260 can also be referred as a p-electrode. A lower electrode 270 is formed on fee lower group III-V nitride layer 220. The lower electrode 270 can also be referred as an n-electrode. The use of transparent ITO material in the conductive layer 250 can significantly increase the conductivity between the electrode 260 and fee upper group III-V nitride layer 240 while maximizing the transmission light out of the upper surface of the conductive layer 250 emitted from fee quantum-well layer 230.

Figure 3:
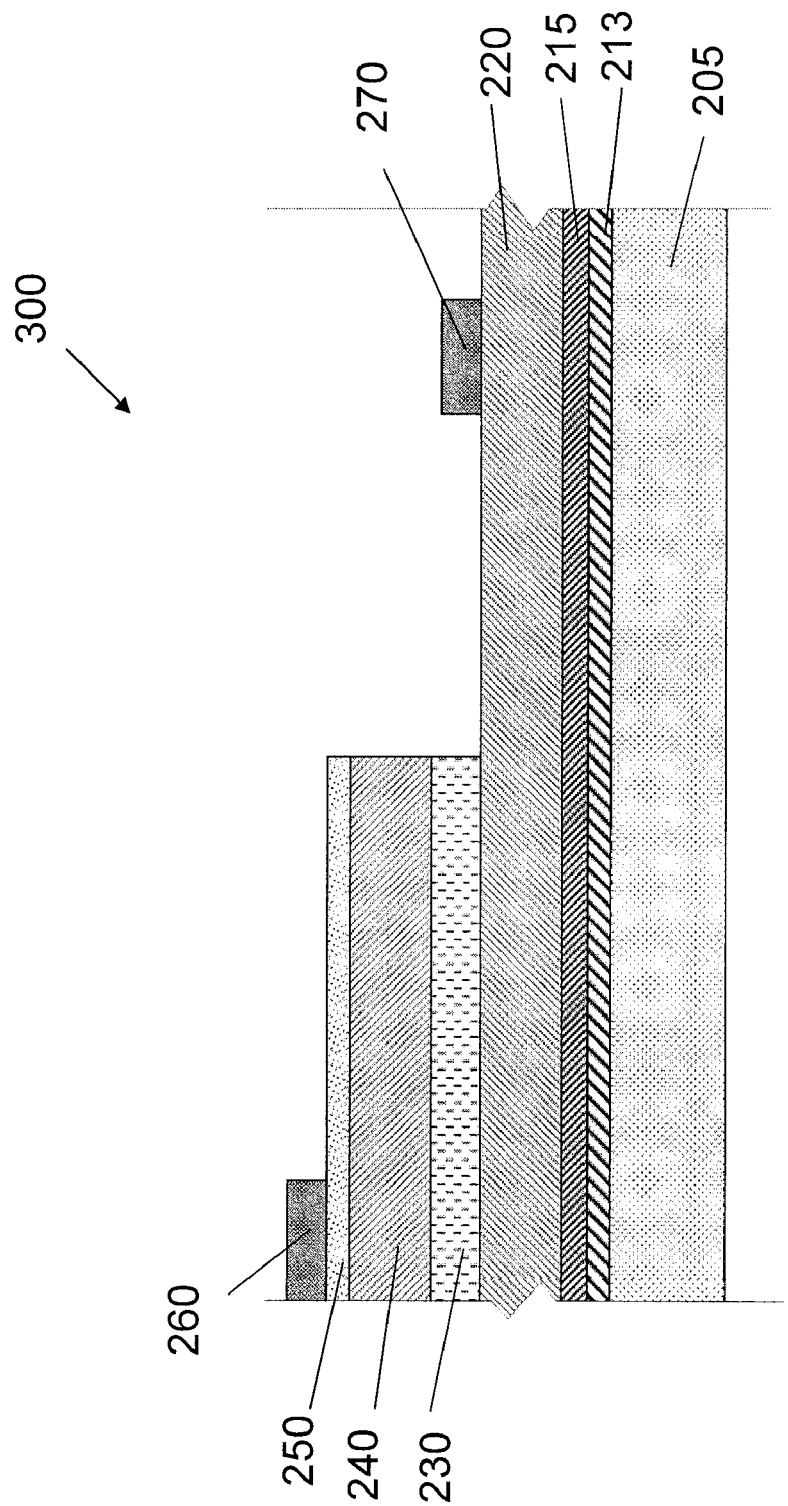
FIG. 3 is a cross-sectional view of another silicon-based LED structure in accordance with the present application.

In some embodiments, referring to FIG. 3, a LED structure 300 includes a substrate 205 that can have an upper surface in the (111) or a (100) crystalline direction. A first buffer layer 213 is formed on fee substrate 205. A second buffer layer 215 is formed on the first buffer layer 213. A lower group III-V nitride layer 220 is then formed on the second buffer layer 215. The quantum-well layer 230, the upper group III-V nitride layer 240, the conductive layer 250, the upper electrode 260, and the lower electrode 270 can then be formed successively similar to that described in relation to the LED structure 300.

Figure 4A:
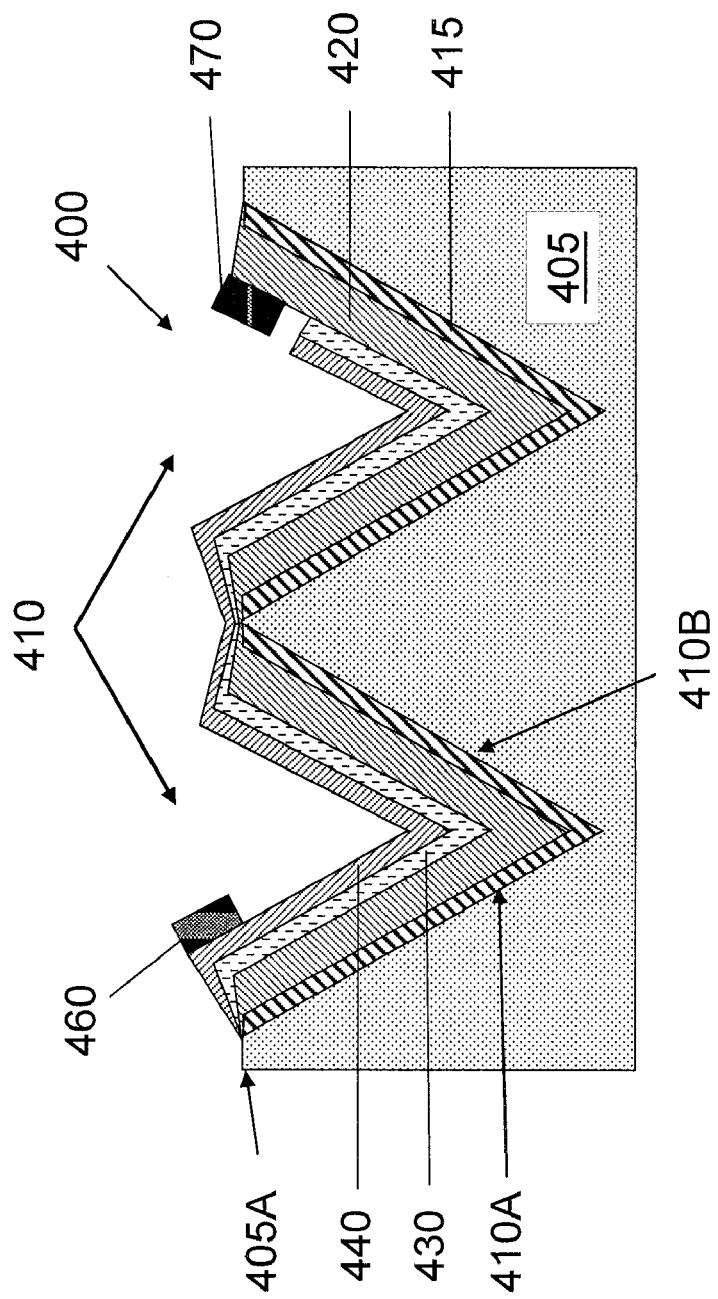
FIG. 4A is a cross-sectional view a silicon-based LED structure built on a V-shaped trench in accordance with the present application.
Figure 4B:
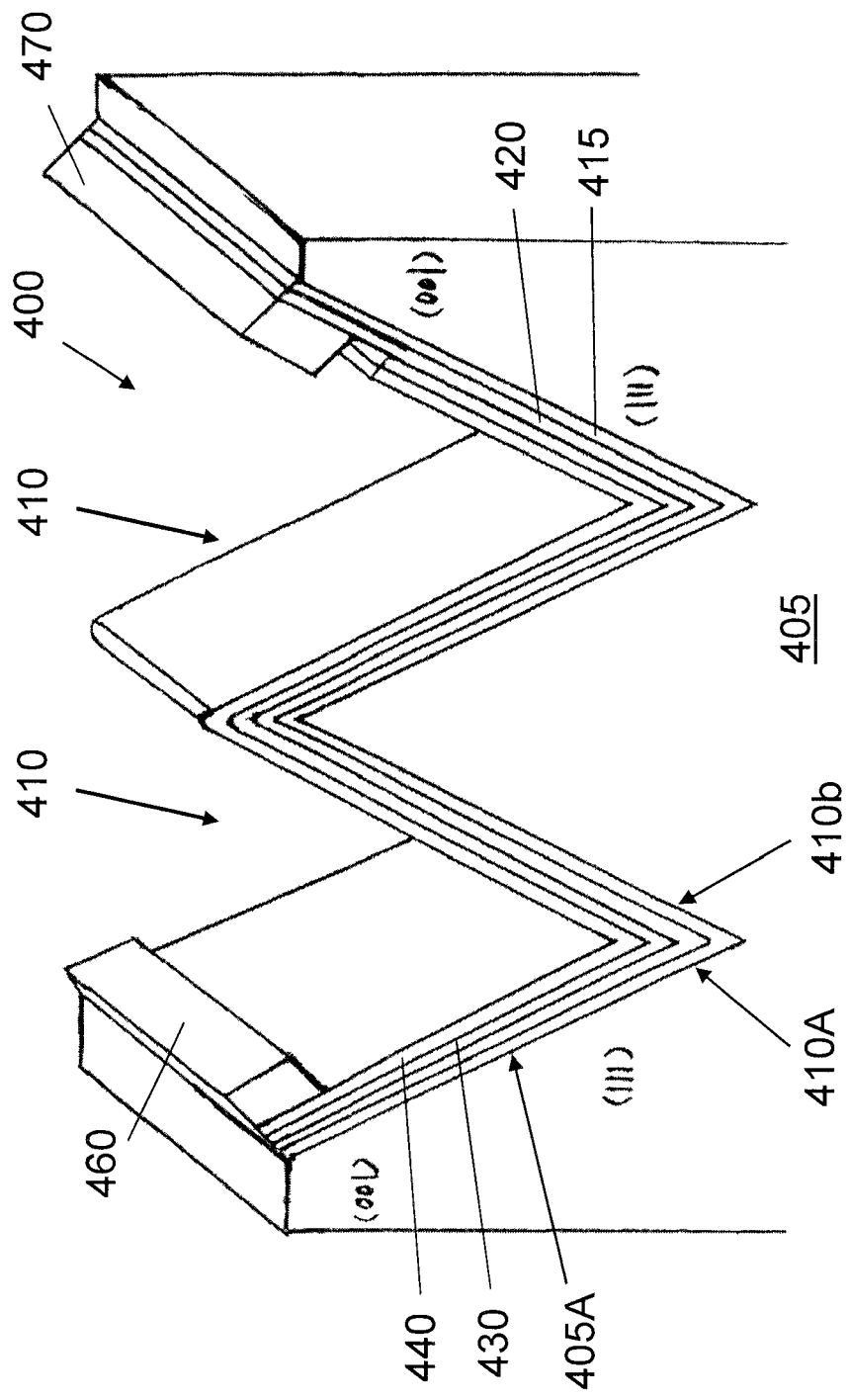
FIG. 4B is a perspective view of the silicon-based LED structure of FIG. 4A.

In some embodiments, referring to FIGS. 4A and 4B, a LED structure 400 can be formed on one or more V-shaped trenches 410 in a substrate 405. The substrate 405 can have an upper surface 405A in the (100) crystalline plane direction, which is the most commonly available silicon substrate in commerce. The substrate 405 can be formed of silicon, silicon oxide, or glass. For a silicon substrate, the substrate 205 can include a (100) or (111) upper surface. The surfaces 410A, 410B of the V-shaped trench 410 can be along the (111) crystalline plane direction. The substrate 405 can also include a complimentary metal oxide semiconductor (CMOS) material that includes an electric circuitry for driving and controlling the LED structure 400.

A buffer layer 415 is formed on the surface 405A of fee substrate 405 and the sloped surfaces 410A, 410B in the V-shaped trenches 410. As described in more detail below in conjunction with FIG. 7, the buffer layer 415 can be formed by one or more materials such as TaN, TiN, GaN, ZnO, AlN, HfN, AlAs, or SiC. The buffer layer 415 can have a thickness in the range of 1 to 1000 Angstroms, such as 10 to 100 Angstroms.

A lower group III-V nitride layer 420 is formed on die buffer layer 415. The lower group III-V nitride layer 420 can be formed by silicon doped n-GaN. The lower group III-V nitride layer 420 can have a thickness in the range of 1 to 50 micron such as 10 microns. A quantum-well layer 430 is formed on the lower group III-V nitride layer 420. The quantum-well layer 430 can be made of InN or InGaN with a thickness in the range of 5 to 200 Angstroms, such as 50 Angstroms. An upper group III-V nitride layer 440 is formed on the quantum-well layer 430. The upper group III-V nitride layer can be an aluminum doped p-GaN layer 440 having a thickness in the range of 0.1 to 10 micron such as 1 micron. The quantum-well layer 430 can form a quantum well between the lower group III-V nitride layer 420 and the upper group III-V nitride layer 440. A conductive layer (not shown) is optionally formed on the upper group III-V nitride layer 440. The conductive layer is at least partially transparent. Materials suitable for the conductive layer can include ITO and Ni/Au. An upper electrode 460 can be formed on the conductive layer (or the upper group III-V nitride layer 440 in absence of the conductive layer). The inclusion of the conductive layer can be at least determined by whether the substrate 405 is thinned to all allow more emitted light to exit the LED structure 400. The conductive layer is preferably included if the substrate 405 is not thinned so more light can exit the LED structure 400. A lower electrode 470 can then be formed on the lower group III-V nitride layer 420.

The quantum-well layer 430 can form a quantum well for electric carriers in between the lower group III-V nitride layer 420 and the upper group III-V nitride layer 440. An electric voltage can be applied across the lower electrode 470 and the upper electrode 460 to produce an electric field in the quantum-well layer 430 to excite carriers in the quantum well.

The quantum-well layer 430 can form a quantum well for electric carriers in between the lower group III-V nitride layer 420 and the upper group III-V nitride layer 440. The recombinations of the excited carriers can produce light emission. The emission wavelengths are determined mostly by the bandgap of the material in the quantum-well layer 430.

Figure 6:
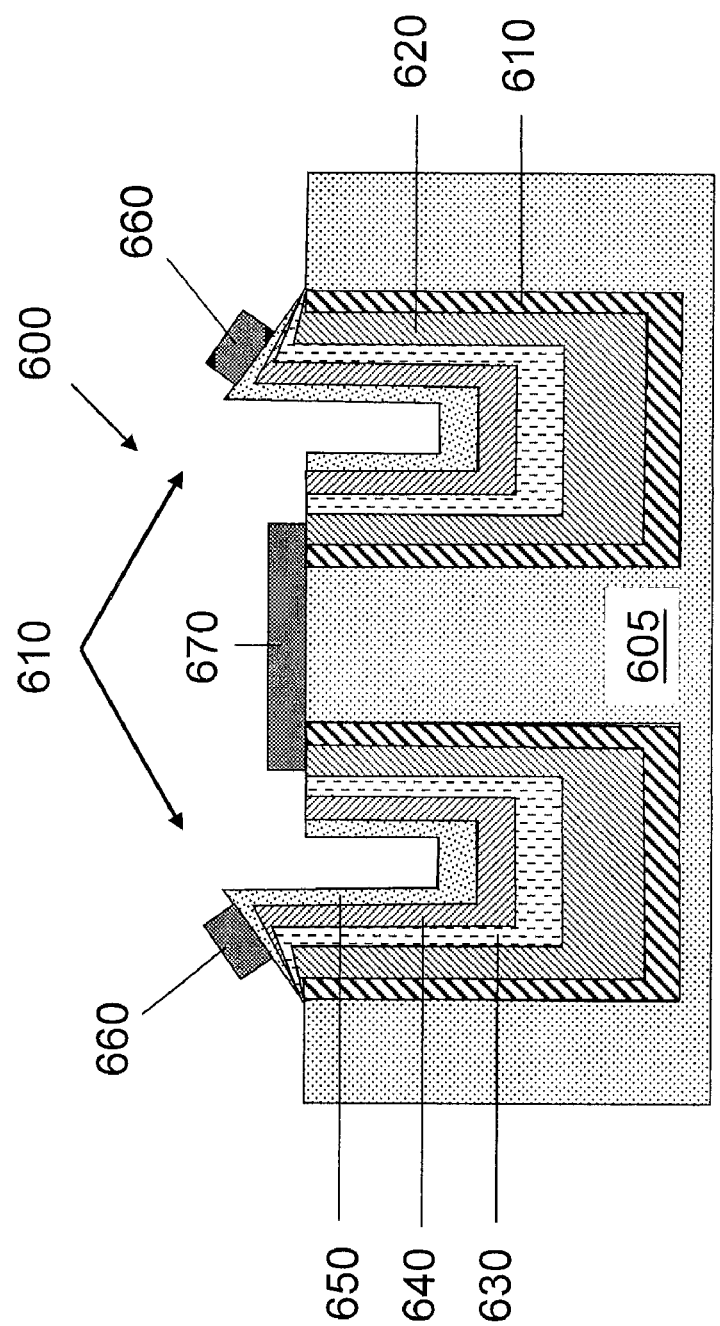
FIG. 6 is a cross-sectional view of another silicon-based LED structure built on a U-shaped trench in accordance with the present application.

In some embodiments, referring to FIG. 6, an LED structure 600 includes a substrate 605 having one or more U-shaped trenches 610. The U-shaped trenches 610 can have surfaces substantially perpendicular to the upper surface of a substrate 605. A buffer layer 610 is formed on the upper surfaces of the substrate 605 and the side surfaces in the U-shaped trenches 610. A lower group III-V nitride layer 620 is then formed on the buffer layer 610. An quantum-well layer 630, an upper group III-V nitride layer 640, an optional conductive layer 650, an upper electrode 660, and a lower electrode 670 can then be formed successively similar to that described in relation to the LED structures 200, 300, or 400.

An advantage for the LED structures formed in the trenches is that the light emission from the sloped or vertical surfaces in the V-shaped and U-shaped trenches (410 and 610) can be more effective than flat horizontal surfaces. Light emission efficiency can thus be significantly increased.

Figure 5A:
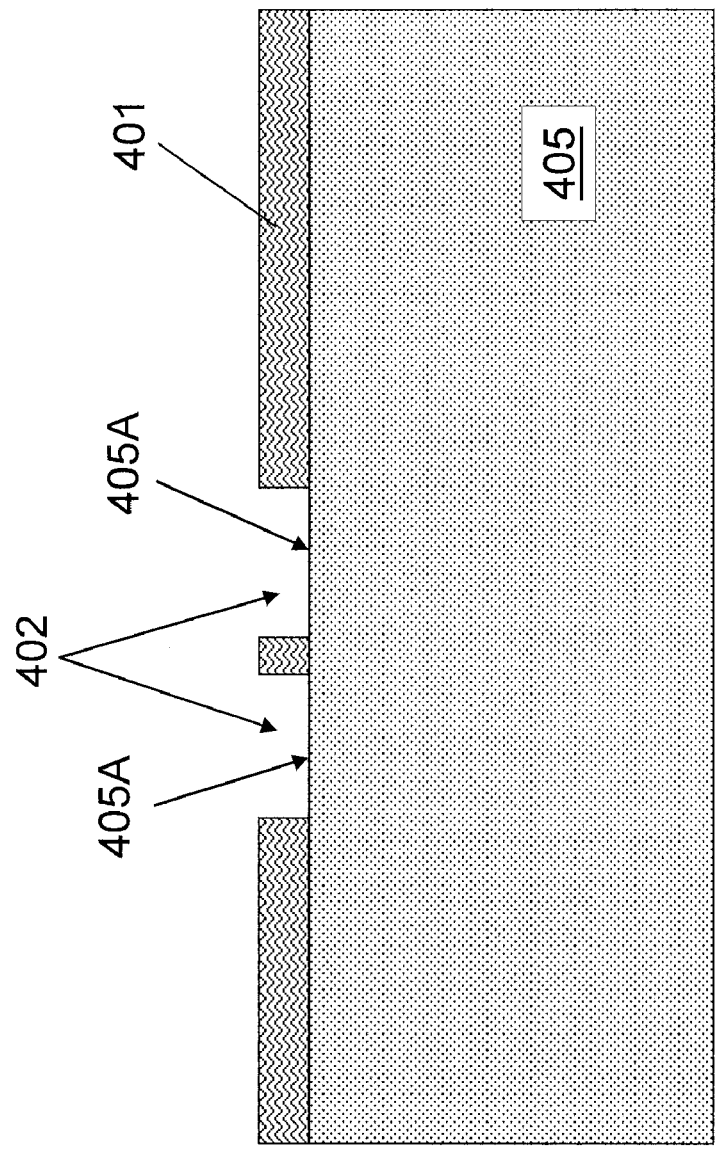
FIGS. 5A-5I are cross-sectional views at different steps of forming the silicon-based LED structure of FIG. 4A.
Figure 5B:
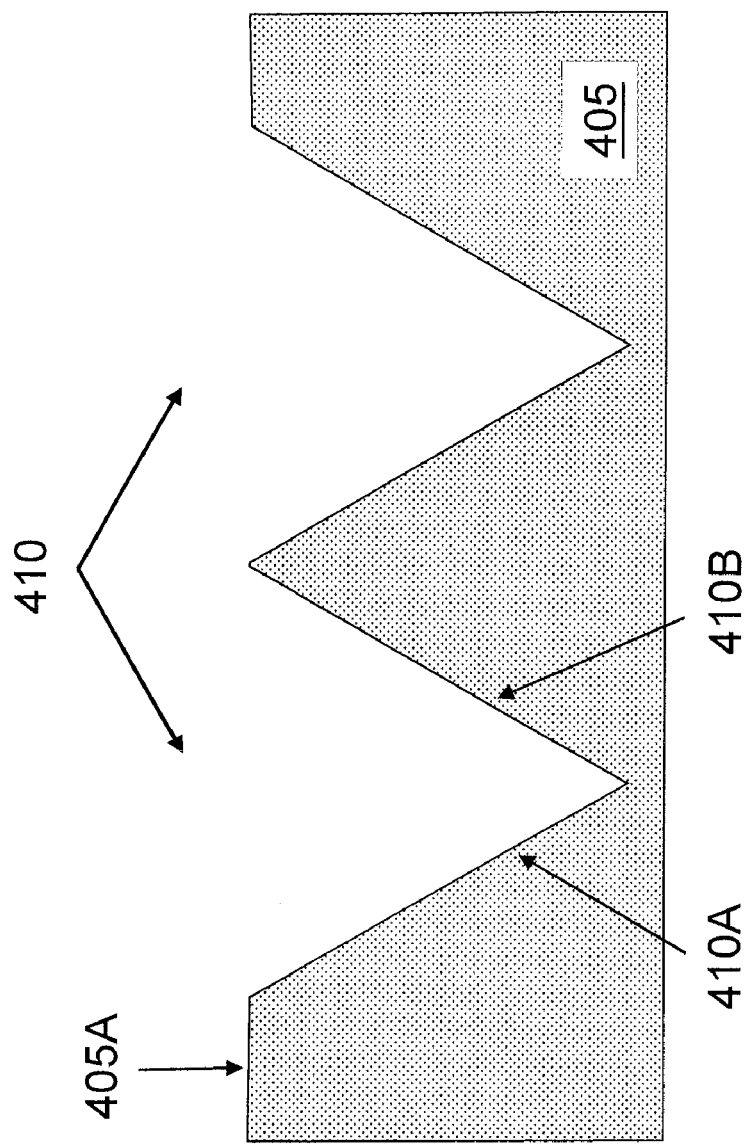
Figure 5C:
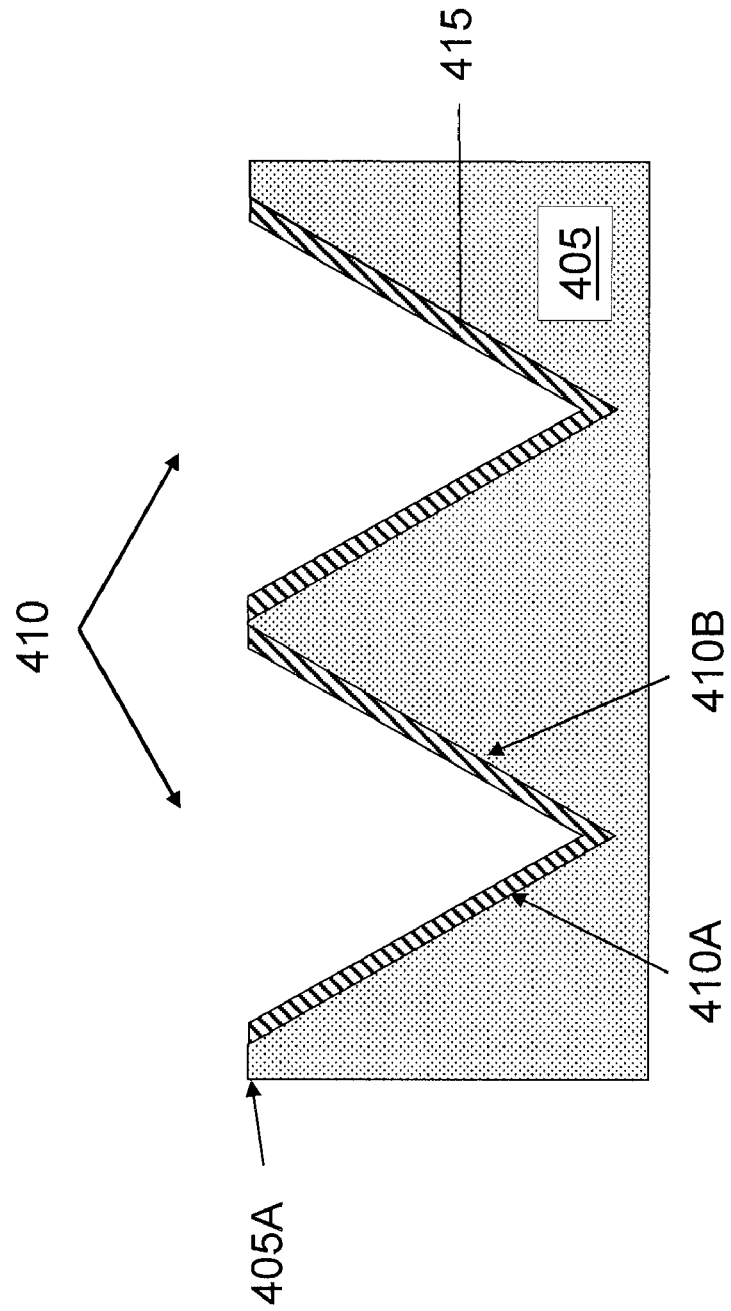
Figure 5D:
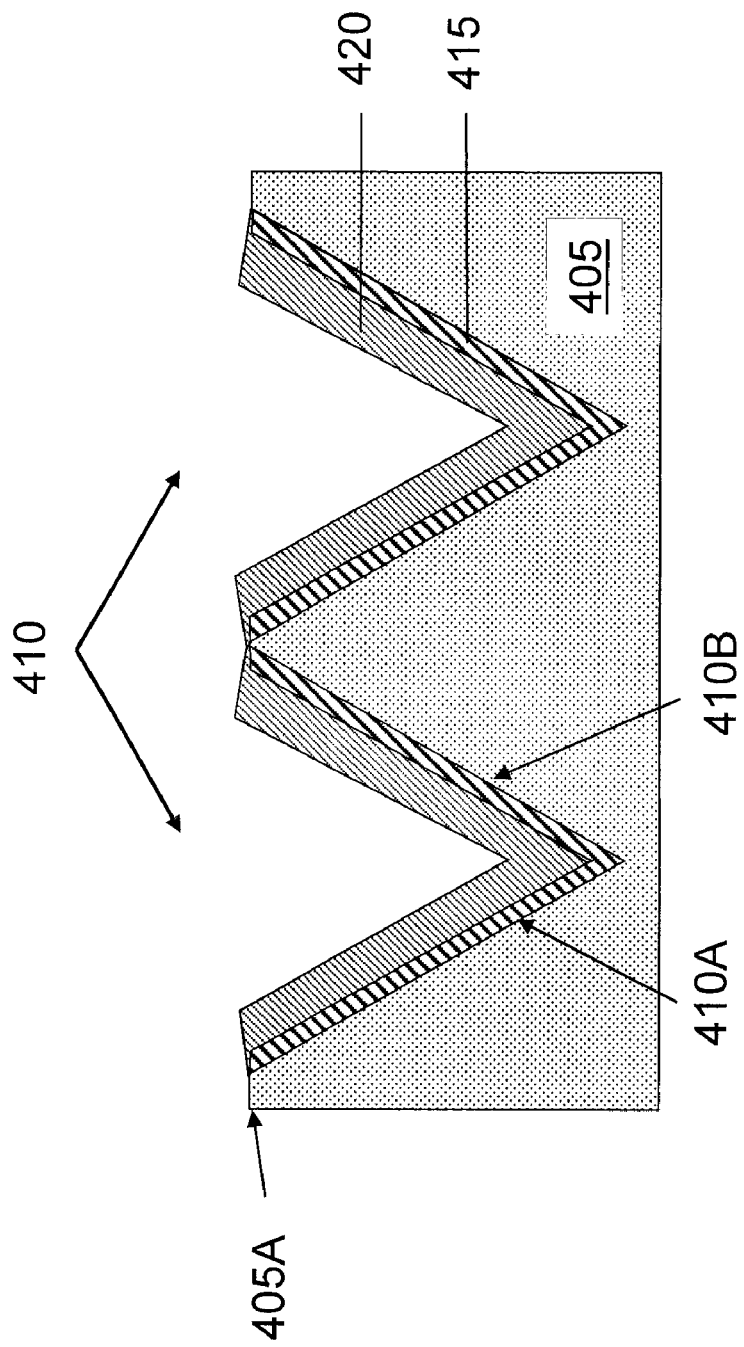
Figure 5E:
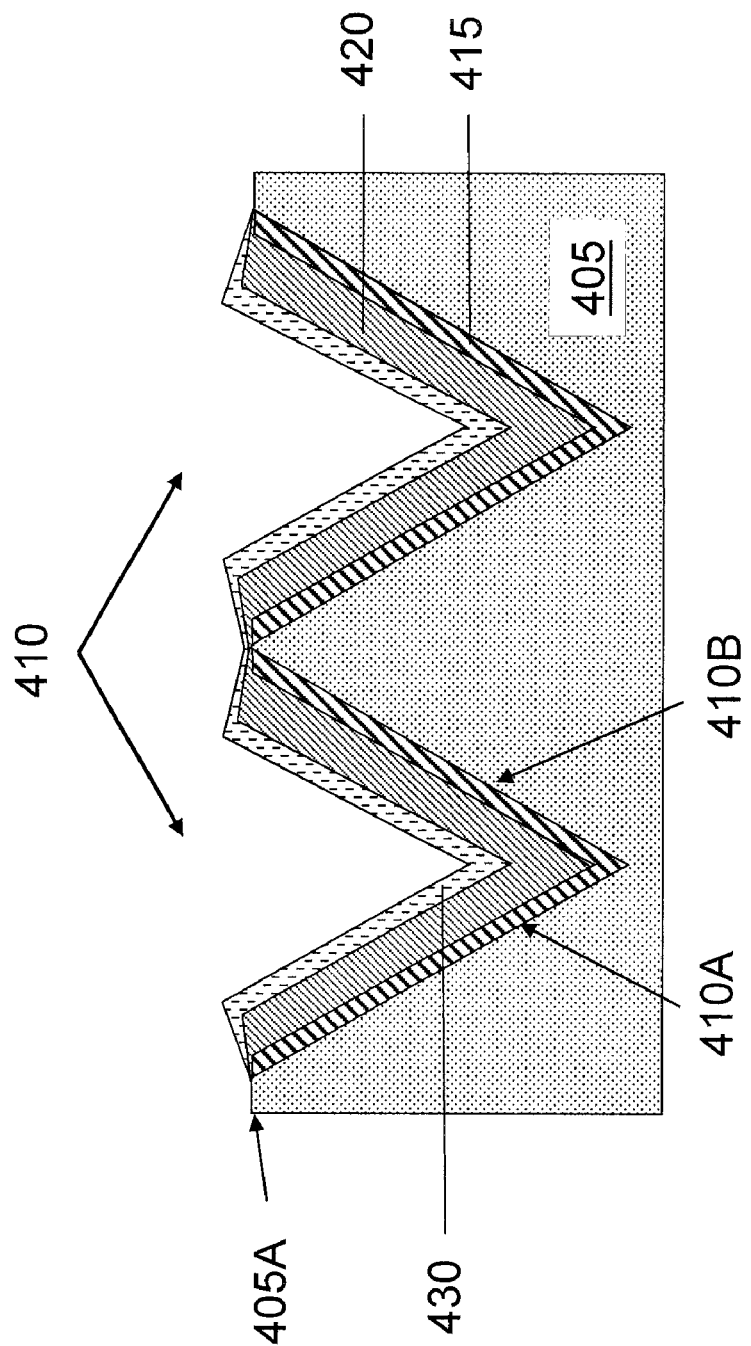
Figure 5F:
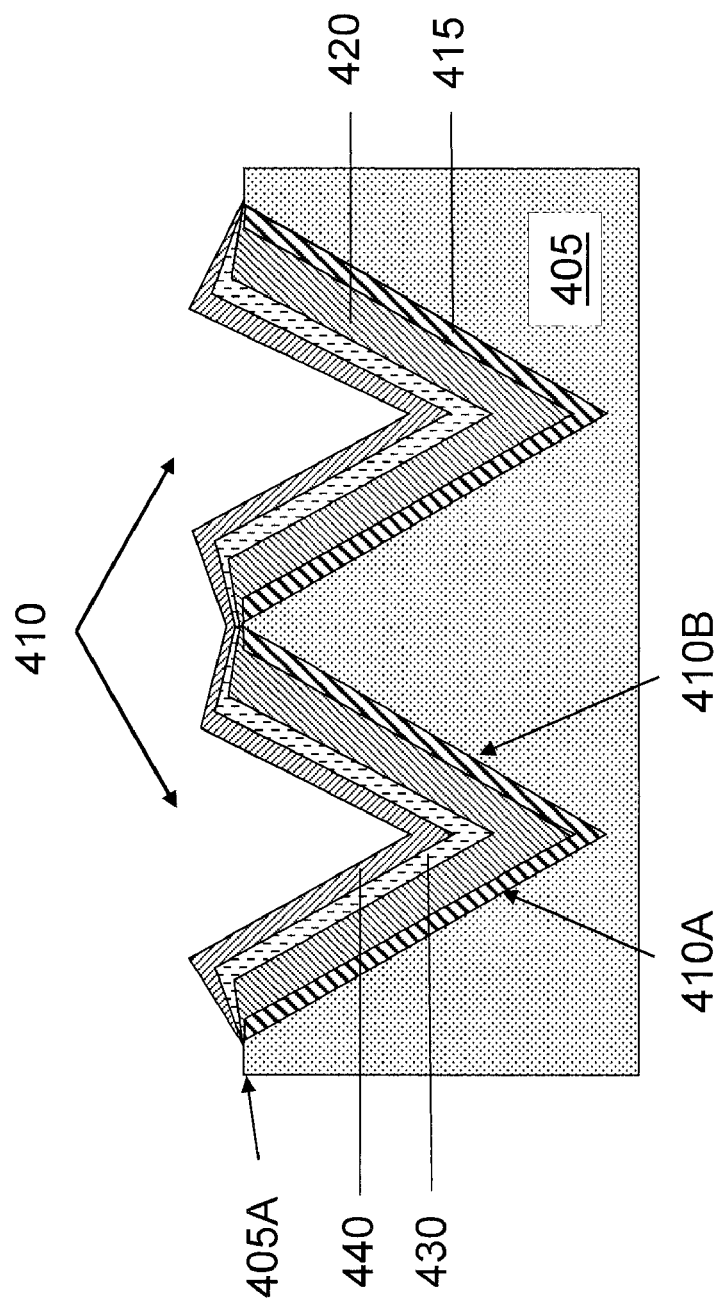
Figure 5G:
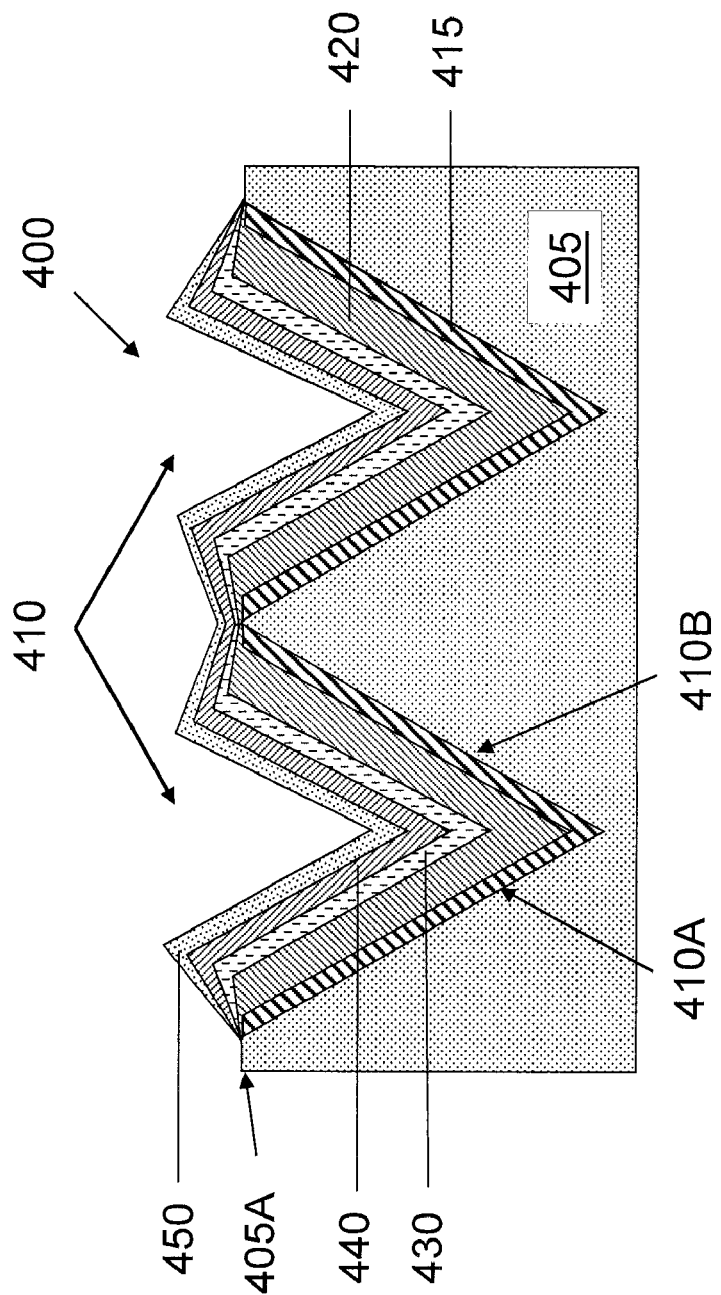

Referring to FIGS. 5A-5I, and 7, the fabrication process of the LED structure 400 (200, 300, or 600) can include the following steps. A mask layer 401 is formed on the substrate 405 (FIG. 5A). The substrate 405 has an upper surface 405A. The openings 402 in the mask layer 401 are intended to define the locations and the openings of the trenches to be formed. One or more V-shaped trenches 410 are formed in a substrate 405 (step 710, FIG. 5B). The V-shaped trench 410 can be formed by chemically etching of the substrate 405. For example, an etchant may have a slower etching rate for the (111) silicon crystal plane than in other crystalline plane directions. The etchant can thus create V-shaped trenches 410 in the substrate 405 wherein the trench surfaces 410A, 410B are along the (111) silicon crystal planes. The U-shaped trenches 610 can be formed by directional plasma etching. For the LED structures 200 and 300, the step 710 can be skipped.

Figure 1:
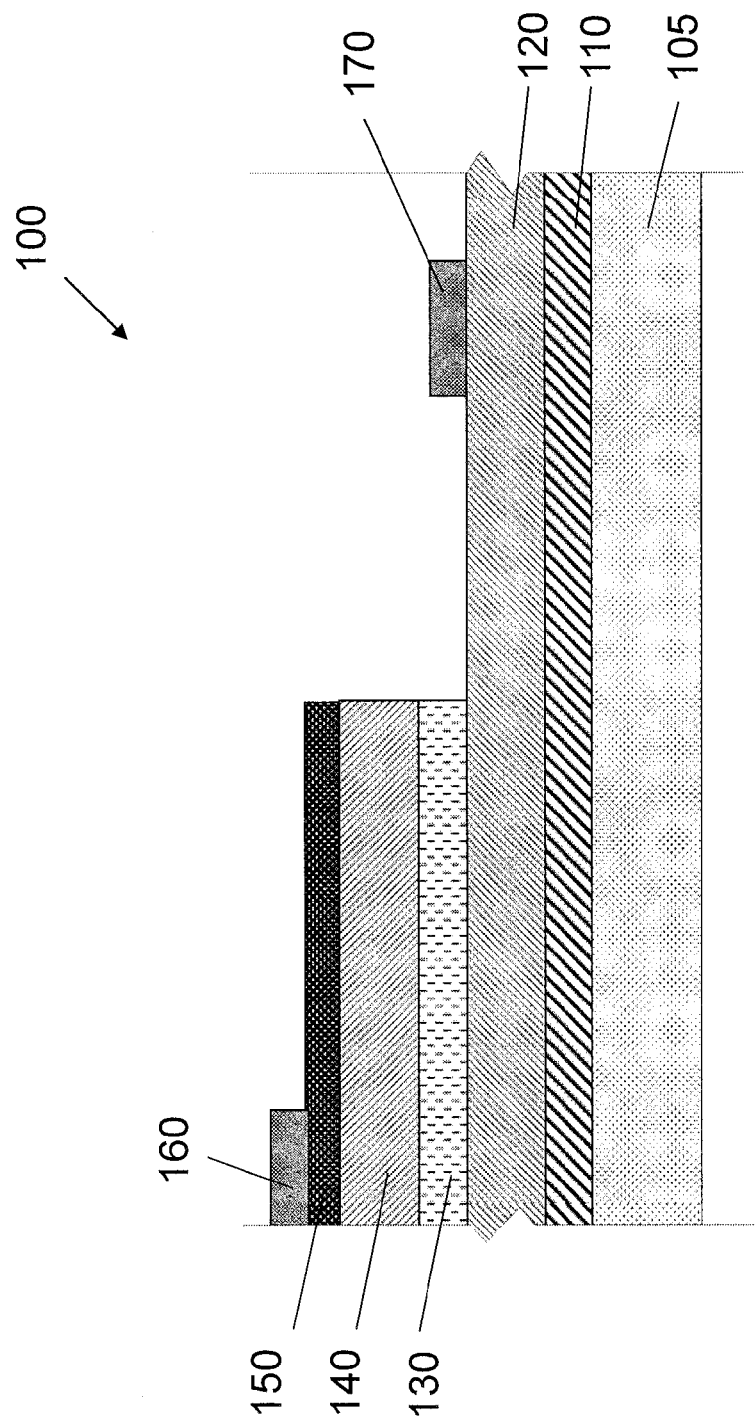
FIG. 1 is a cross-sectional view of a conventional semiconductor-based LED structure.

One or more buffer layers can next be next formed on the substrate 405 using atomic layer deposition (ALD) or MOCVD (step 720). For example, referring to FIG. 3, a first buffer layer 213 (or 210) is next formed on the substrate 205 using atomic layer deposition (ALD) (step 720). The substrate 205 can be a (111) or a (100) silicon wafer. The buffer layer 213 or 210 can be formed of GaN, ZnO, MN, HfN, AlAs, or SiC. The atomic layer deposition of the buffer material can be implemented using commercial equipment such as IPRINT™ Centura® available from Applied Material, Inc. The atomic layer deposition can involve the steps of degassing of a vacuum chamber, the application of a precursor material, and deposition of the buffer material monolayer by monolayer. The substrate (or the chamber) temperature can be controlled at approximately 600 C. The layer thickness to form nucleation in an ALD process can be as thin 12 angstrom, much thinner than the approximately thickness of 300 angstrom required by MOCVD for buffer layer formation in some convention LED structures (e.g. the LED structure 100 depicted in FIG. 1). The step 720 can also be referred as ALD of a low temperature buffer layer.

Still referring to FIG. 3, the first buffer layer 213 is deposited on the substrate 205 using atomic layer deposition (ALD) in a vacuum chamber maintained at a relatively lower temperature in a range of 450C to 950C, such as 600 C. The second buffer layer 215 is deposited on the first buffer layer 213 using atomic layer deposition (ALD) in a vacuum chamber maintained at a relatively higher temperature in a range of 750C to 1050C, such as 900 C. The first and second buffer layers 213 and 215 can be formed of GaN, ZnO, AlN, HfN, AlAs, or SiC. The first and second buffer layer 213 or 215 can have a thickness of about 20-300 Angstroms. The crystal structure of the first buffer layer 213 can have lattices epitaxially matched to the substrate 205. The second buffer layer 215 can have lattices epitaxially matched to the crystal structure of the first buffer layer 213 and the lower group III-V nitride layer 220. The multiple buffer layers in the LED structure 300 can provide smoother lattice matched transition from the substrate 205 to die lower group III-V nitride layer 220.

A second buffer layer 215 is next formed on the first buffer layer 213 using ALD (this step is skipped in the fabrication of the LED structure 400). The material and processing parameters for the second buffer layer 215 can be similar to those for the first buffer layer 213 except the substrate (or the chamber) temperature can be controlled at approximately 1200 C during ALD of the second buffer layer 215. The ALD formation of the buffer layer 210, 213, or 215 on the substrate 205 can reduce or prevent the formation of crystal defects in the buffer layer in some conventional LED structures, which can thus improve the light emitting efficiency of the LED device.

Referring to FIG. 4A, for the LED structure 400, the buffer layer 415 can be formed by MOCVD, PVD, or ALD on the surface 405A of the substrate 405 and the sloped surfaces 410A, 410B in the V-shaped trenches 410. The buffer layer 415 can be formed by ALD of TaN or TiN materials. In other examples, the formation of the buffer layer 415 can include one of the following procedures: depositions of AlN at 1000C and GaN at 1000C using MOCVD (which together, as one of ordinary skill knows, forms AlGaN), deposition of GaN at 700C using MOCVD followed by deposition of GaN at 1000C using MOCVD, deposition of HfN at 500C using PVD followed by deposition of GaN using MBE at 700C, and deposition of SiCN at 1000C using MOCVD followed by deposition of GaN at 1000C using MOCVD.

The materials suitable for the buffer layer 415 can also include GaN, ZnO, AlN, HfN, AlAs, or SiC. The buffer layer 415 can also be formed by ALD using the steps described above in relation to the formations of the buffer layers 213 and 215. For example, the ALD formation of the buffer layer 415 can involve the use' of TaN or TiN and a layer thickness of 10to 100 Angstroms. Atomic layer deposition (ALD) is a "nano" technology, allowing ultra-thin films of a few nanometers to he deposited in a precisely controlled way. ALD has the beneficial characteristics of self-limiting atomic layer-by-layer growth and highly conformal to the substrate. For the formation of buffer layer in the LED structures, ALD can use two or more precursors such as liquid halide or organometallic in vapor form. The ALD can involve heat to dissociate the precursors into the reaction species. One of the precursors can also be a plasma gas. By depositing one layer per cycle, ALD offers extreme precision in ultra-thin film growth since the number of cycles determines the number of atomic layers and therefore the precise thickness of deposited film. Because the ALD process deposits precisely one atomic layer in each cycle, complete control over the deposition process is obtained at the nanometer scale. Moreover, ALD has the advantage of being capable of substantially isotropic depositions. ALD is therefore beneficial for depositing buffer layers on the sloped surfaces 410A and 410B in the V-shape trenches 410, and the vertical surfaces in the U-shape trench 610 to be described later.

One advantage for forming the buffer layer 415 on the surfaces 410A and 410B in the V-shape trenches 410 is that the (111) crystalline direction of the surfaces 410A and 410B can allow better lattice matching between silicon substrate, the buffer layer 415, and the lower group III-V nitride layer 420. Better lattice matching can significantly reduce the cracking problems caused by lattice mismatches in some convention LED structures.

Figure 7:
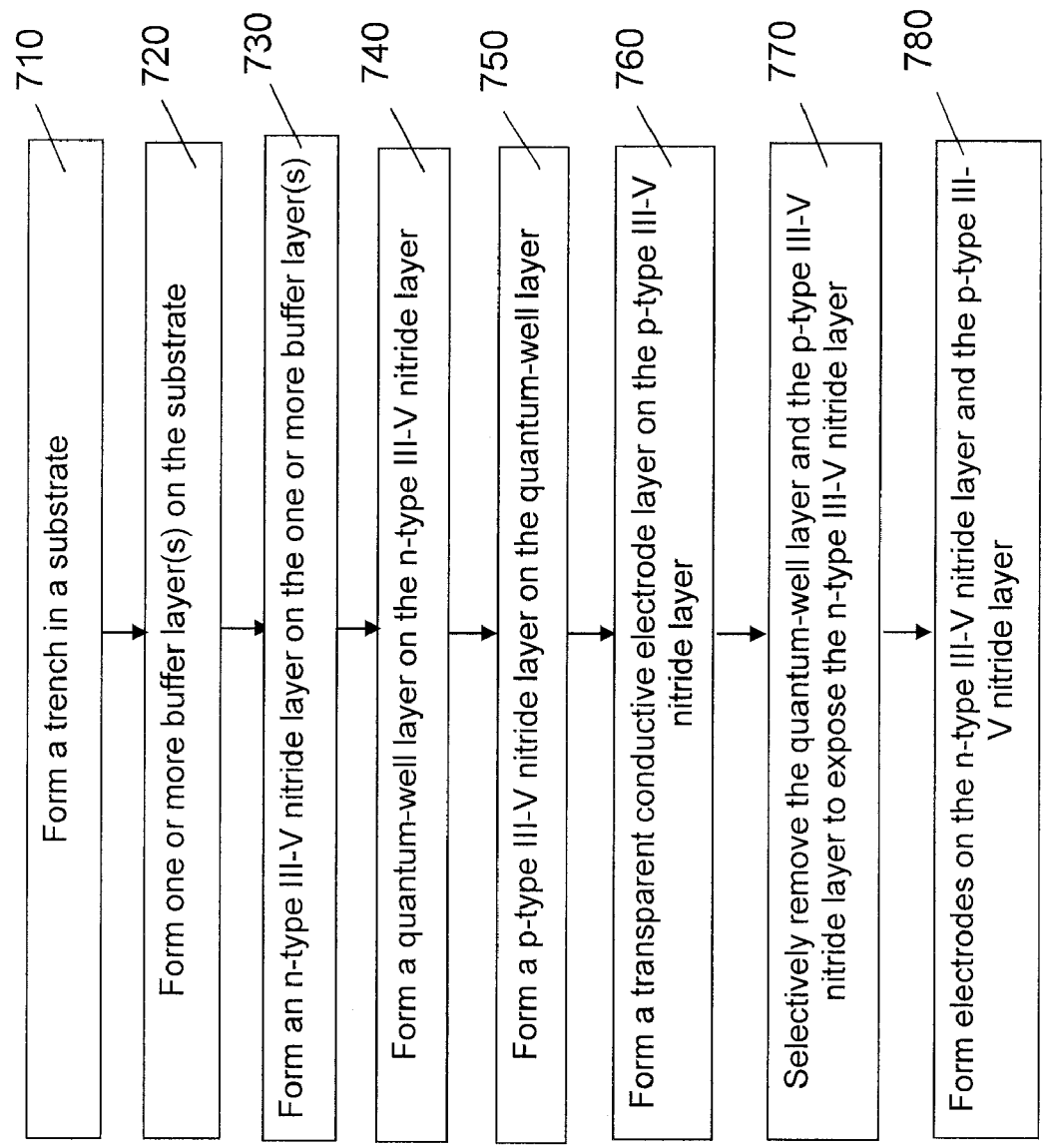
FIG. 7 is a flowchart for fabricating silicon-based lighting devices of FIGS. 2-6.

A lower group III-V nitride layer 420 is next formed on the buffer layer 415 (step 730, Figure 7). The lower group III-V nitride layer 420 can be formed by an n-type doped GaN material. Si-doped GaN can be grown on the buffer layer 415 using MOCVD The silicon doping can enhance tensile stresses to make the compression and tensile strengths snore balanced. As a result, cracks can be substantially prevented in the formation of the lower group III-V nitride layer 420.

A quantum-well layer 430 is next formed on the lower group III-V nitride layer 430 (step 740, Figure 7). The quantum-well layer 430 can include a substantially uniform layer made of InN, GaN, or InGaN, The quantum-well layer 430 can also include a multi-layer structure defining one or more quantum wells. A quantum well can for example be formed by an InGaN layer sandwiched in between two GaN layers or AlGaN layers. The quantum-well layer 430 can include one or a stack of such layered structures each defining a quantum well.

An upper group III-V nitride layer 440 is formed on the quantum-well layer 430 (step 750, Figure 7). Instead of having the lower group III-V nitride layer 420 n-type doped and the upper group III-V nitride layer 440 p-type doped, fee lower group III-V nitride layer 420 can be p-type doped and the upper group III-V nitride layer 440 can be n-type doped (as shown in the flow chart of FIG. 8).

Figure 5H:
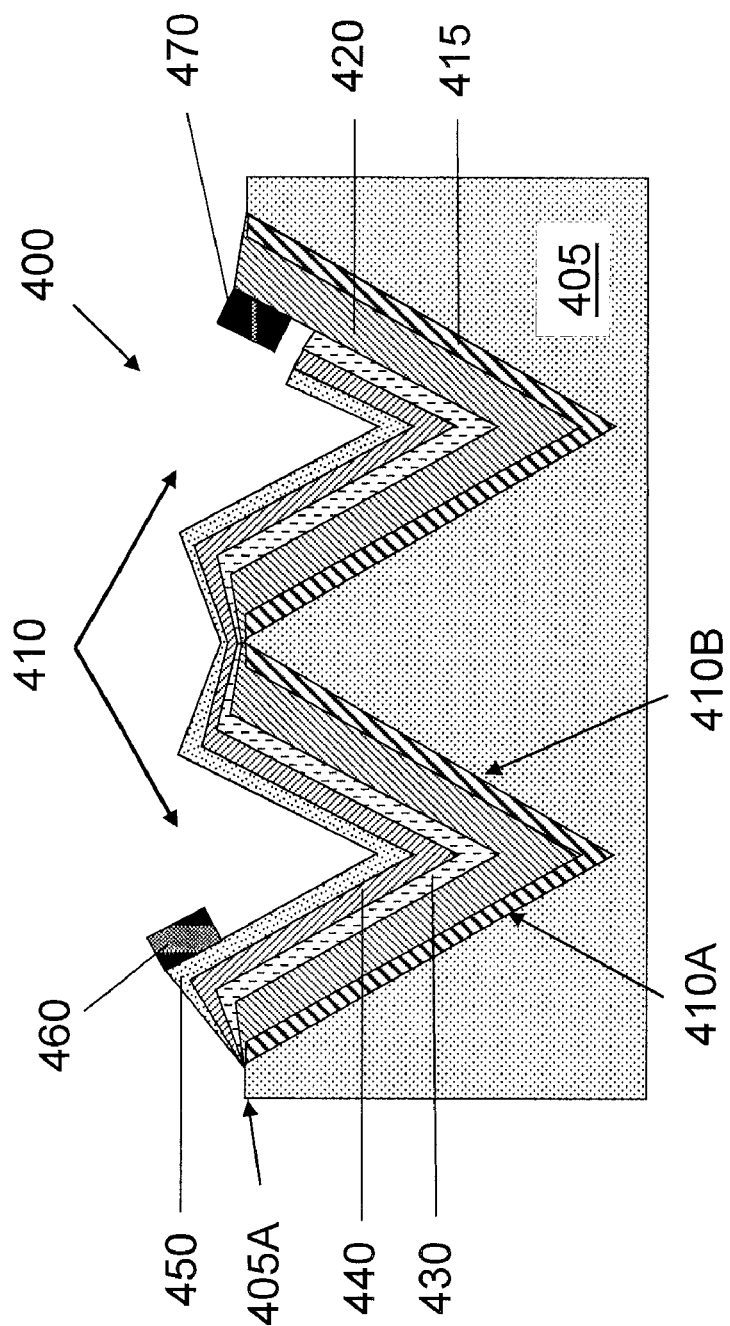

Referring to FIG. 5H, a transparent conductive layer 450 can next be optionally formed on the upper group III-V nitride layer 440 (step 760, Figure 7).

The formation of fee quantum-well layer can include multiple MOCVD steps. For example, each of the multiple steps can include the deposition of a layer 50 Angstroms in thickness. The quantum-well layer 430, the upper group III-V nitride layer 440, and the conductive layer 450 can also be formed by MOCVD. The MOCVD formations of the lower group III-V nitride layer 420, the quantum-well layer 430, the upper group III-V nitride layer 440, and fee conductive layer 450 and the ALD formation of the buffer layers 415 can be formed in a same ALD/CVD chamber system to minimize the number of times the substrate moves in and out of vacuum chambers. The process throughput can be further improved. Impurities during handling an also be reduced.

The combined quantum-well layer 430, the upper group III-V nitride layer 440, and the conductive layer 450 can next be coated by a photo resist and patterned by photolithography. Portions of the combined quantum-well layer 430, the upper group III-V nitride layer 440, and the conductive layer 450 can then be removed by wet etching to expose a portion of the upper surface of the lower group III-V nitride layer 420 (step 770, Figure 7H).

The upper electrode 460 is next formed on the conductive layer 450 (step 780, Figure 7). The upper electrode 460 can include Ni/Au bi-layers that have thicknesses of 12 nm and 100 nm respectively. The fabrication of the upper electrode 460 can involve the coating of a photo resist layer on the conductive layer 450 and the exposed upper surface of the lower group III-V nitride layer 420. The photo resist layer is then patterned using photolithography and selectively removed to form a mask. Electrode materials are next successively deposited in the openings in the mask. The unwanted electrode materials and the photo resist layer are subsequently removed.

The lower electrode 470 is next formed on the lower group III-V nitride layer 420 (FIG. 5H). The lower electrode 470 can include AuSb/Au bi-layers. The AuSb layer is 18 nm in thickness whereas the Au layer is 100 nm in thickness. The formation of the lower electrode 470 can also be achieved by forming a photo resist mask having openings on the lower group III-V nitride layer 420, the depositions of the electrode materials and subsequent removal of the unwanted electrode materials and the photo resist layer. The LED structure 400 is finally formed.

Figure 5I:
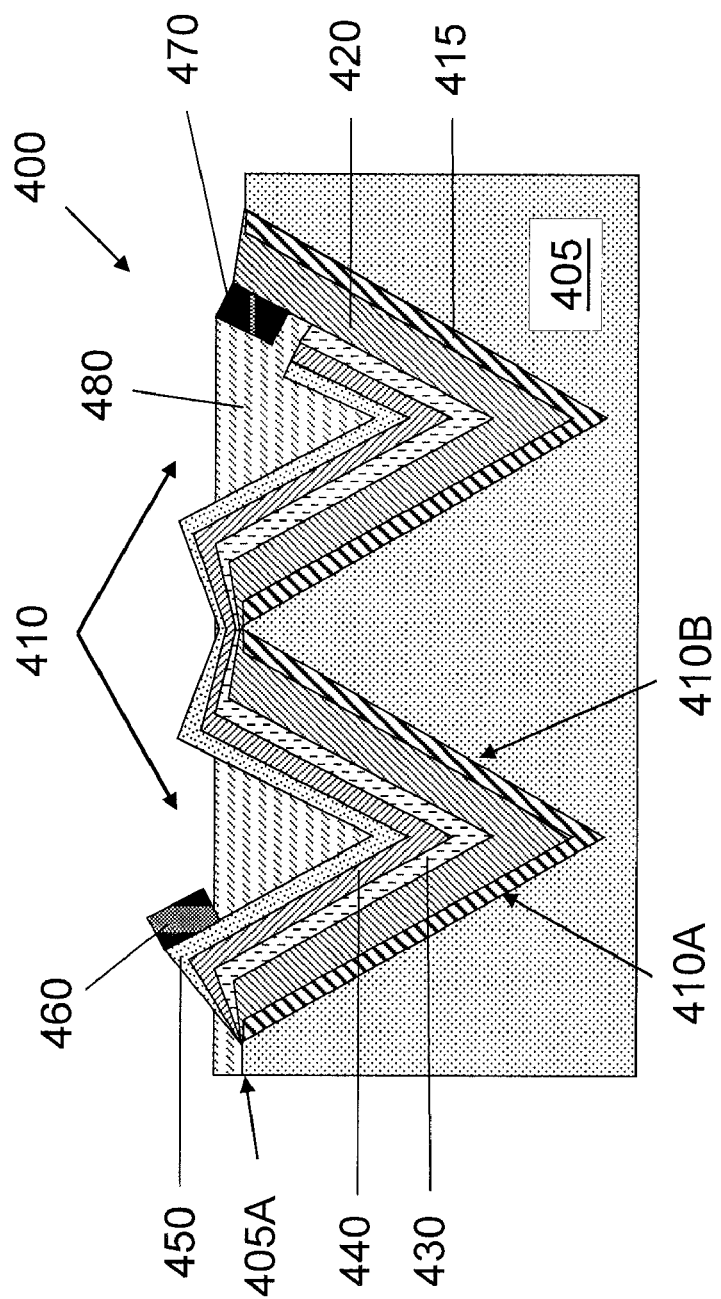

Optionally, referring to FIG. 5I, a protection layer 480 cart be introduced over the LED structure 400A for protecting it from moisture, oxygen, and other harmful substance in the environment. The protection layer 480 can be made of a dielectric material such as silicon oxide, silicon nitride, or epoxy. The protection layer can be patterned to expose the upper electrode 460 and the lower electrode 470 to allow them to receive external electric voltages. In some embodiments, the protection layer can also include thermally conductive materials such as Al and Cu to provide proper cooling the LED structure 400A.

Figure 8:
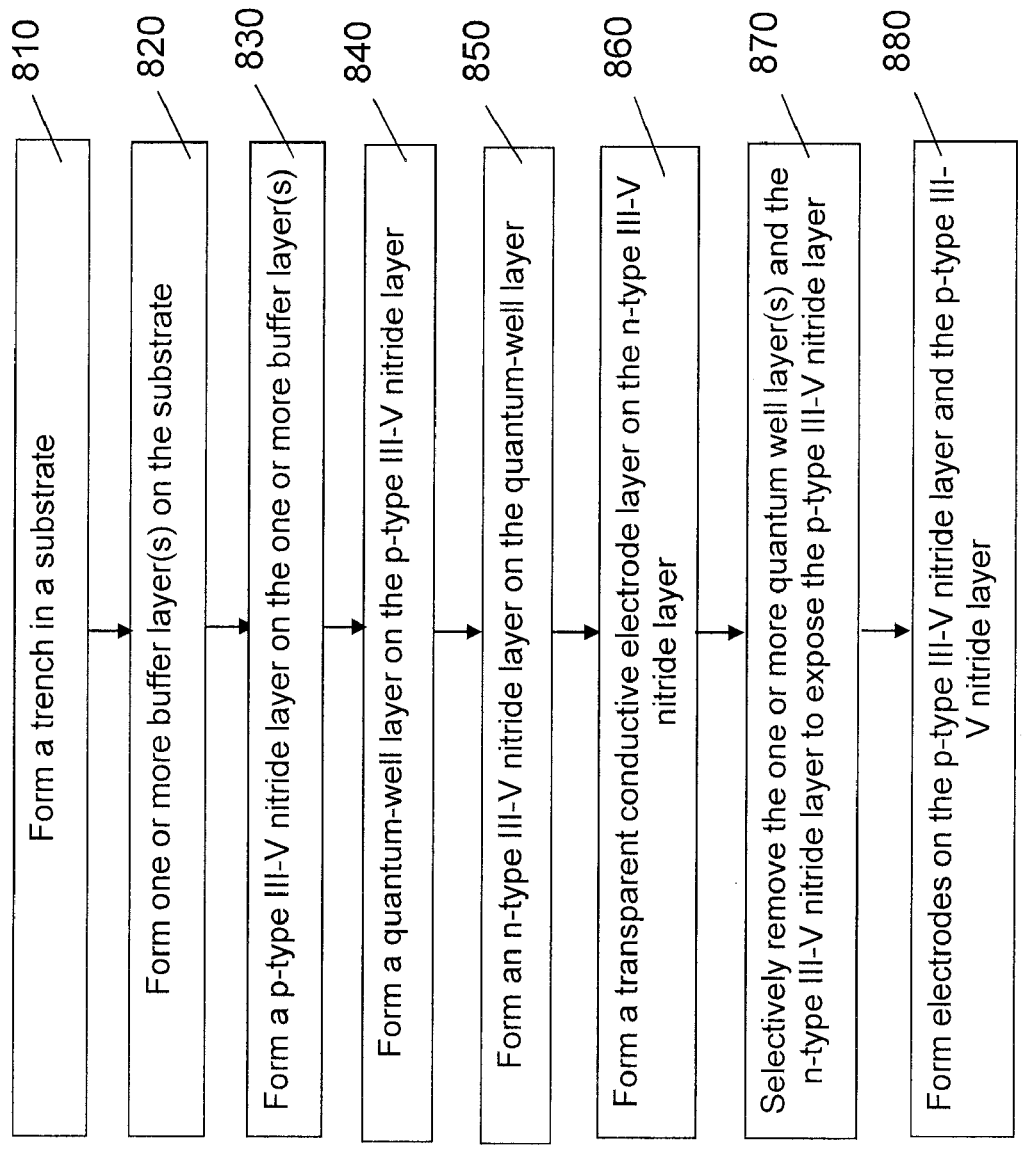
FIG. 8 is another flowchart for fabricating silicon-based lighting devices of FIGS. 2-6.

FIG. 8 is a flowchart for fabricating the LED structure 400 (200, 300, or 600). The steps 810-880 are similar to the steps 710-780 except the lower III-V nitride layer is p-type doped and the upper III-V nitride layer is n-type doped, which is the opposite to the sequence for the two doped III_V layers shown in FIG. 7.

Figure 9:
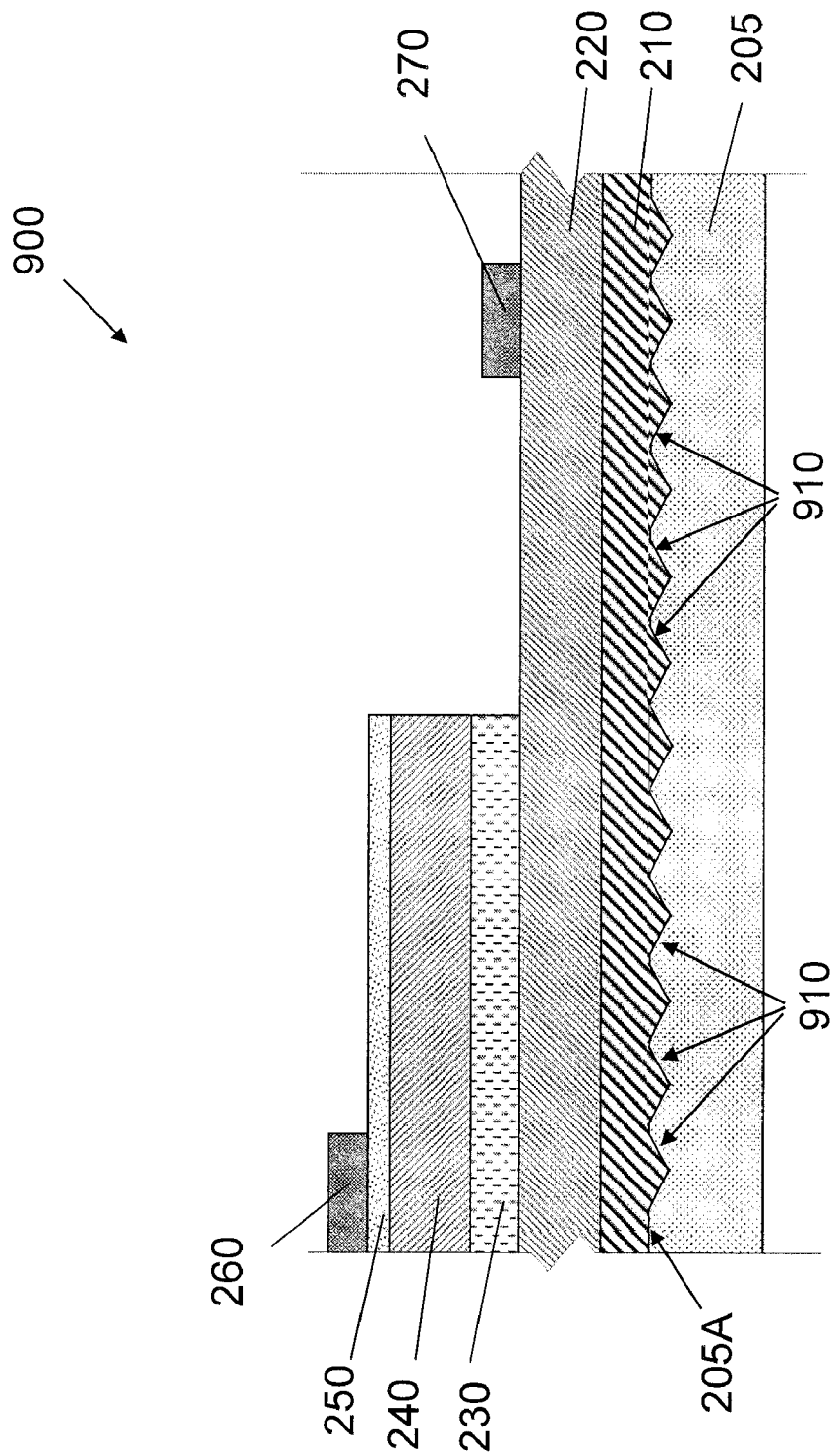
FIG. 9 is a cross-sectional view of another silicon-based LED structure in accordance with the present application.

In some embodiments, referring to FIG. 9, a LED structure 300 is similar to the LED structure 900 except for multi-faceted surfaces 910 are first formed on the substrate 205. The buffer layer 210 is formed on the multi-faceted surfaces 910. The upper surface 205A of the substrate can for example be in the (100) direction (that is the case for most common silicon substrates). The multi-faceted surfaces 910 can be along the (111) crystalline direction. The period of fee multi-faceted surfaces 910 can be in the range between 0.1 micron and 5 microns. The advantage of fee multi-faceted surfaces 910 is that they can help decrease stress due to the latter mismatch between the substrate 205 and the lower III-V nitride layer 220.

The disclosed LED structures and fabrication processes can include one or more of the following advantages. The disclosed LED structures and fabrication processes can overcome associated with can overcome lattice mismatch between the group III-V layer and the substrate and prevent associated layer cracking in conventional LED structures. The disclosed LED structures and fabrication processes can also prevent cracking or delamination in the p-doped or n-doped group III-V nitride layer caused by different thermal expansions between the p-doped group III-V nitride layer and fee substrate. An advantage associated with the disclosed LED structures is that these LED structures can significantly increase light emission efficiency by increasing densities of the LED structures and by providing additional light emissions from the sloped or vertical surfaces in the trenches.

An advantage associated with the disclosed LED structures and fabrication processes is that LED structures can be built in trenches in a substrate. Light emission efficiency can significantly increase by the light emission from the sloped or vertical surfaces in the trenches. Another advantage of the disclosed LED structures and fabrication processes is that silicon wafers can be used to produce solid state LEDs. Manufacturing throughput can be much improved since silicon wafer can be provided in much larger dimensions (e.g. 8 inch, 12 inch, or larger) compared to the substrates used in the conventional LED structures. Furthermore, the silicon-based substrate can also allow driving and control circuitry to be fabricated in the substrate. The LED device can thus be made more integrated and compact than conventional LED devices. Another advantage associated with the disclosed LED structures and fabrication processes is that the disclosed LED structures can be fabricated using existing commercial semiconductor processing equipment such as ALD and MOCVD systems. The disclosed LED fabrication processes can thus be more efficient in cost and tune than some conventional LED structures that need customized fabrication equipments. The disclosed LED fabrication processes are also more suitable for high-volume semiconductor lighting device manufacture. Yet another advantage of the disclosed LED structures and fabrication processes is that multiple buffer layers can be formed to smoothly match fee crystal lattices of the silicon substrate and the lower group III-V nitride layer. Yet another advantage of the disclosed LED structures and fabrication processes is that a transparent conductive layer can be formed on the upper III-V nitride layer of the LED structures to increase electric contact between the upper electrode and the upper Group III-V layer, and at the same time, maximizing light emission intensity from the upper surfaces of the LED structures.

The foregoing descriptions and drawings should be considered as illustrative only of the principles of the invention. The invention may foe configured in a variety of shapes and sizes and is not limited by the dimensions of the preferred embodiment. Numerous applications of the present invention will readily occur to those skilled in the art. Therefore, it is not desired to limit the invention to the specific examples disclosed or the exact construction and operation shown and described. Rather, all suitable modifications and equivalents may be resorted to, falling within the scope of the invention. For example, the n-doped and the p-doped group III-V nitride layers can be switched in position, that is, the p-doped group III-V nitride layer can be positioned underneath fee quantum-well layer and n-doped group III-V nitride layer can be positioned on the quantum-well layer. The disclosed LED structure may be suitable for emitting green, blue, and emissions of other colored lights.

It should be noted that the disclosed systems and methods are compatible with a wide range of applications such as laser diodes, blue/UV LEDs, Hall-effect sensors, switches, UV detectors, micro electrical mechanical systems (MEMS), and RF power transistors. The disclosed devices may include additional components for various applications. For example, a laser diode based on the disclosed device can include reflective surfaces or mirror surfaces for producing lasing light. For lighting applications, the disclosed system may include additional reflectors and diffusers.

It should also be understood that the presently disclosed semiconductor devices are not limited to the trenches described above. A substrate can include a first surface having a first orientation and a second surface having a second orientation. The first and the second surfaces may or may not form a trench or part of a trench. A plurality of III-V nitride layers can be formed on the substrate. The III-V nitride layers can emit light when an electric current is produced in the III-V nitride layers.

What is claimed is:

1. A semiconductor device, comprising:
a silicon semiconductor substrate comprising a first surface having a (111) orientation and a second surface having a second orientation different from the (111) orientation;
a buffer layer of buffer material on the first surface, the second surface being substantially free of buffer material; and
two III-V nitride layers of opposite polarity type on the buffer layer,
a quantum-well layer between the two III-V layers, wherein the two III-V nitride layers and the quantum-well layer are configured to emit light when an electric current is passed through the layers.

2. The semiconductor device of claim 1, wherein the silicon semiconductor substrate further comprises a trench that defines the first surface.

3. The semiconductor device of claim 2, wherein the second surface is parallel to the (100) crystal plane.

4. The semiconductor device of claim 1, wherein the buffer layer comprises a first buffer layer and a second buffer layer, wherein the first buffer layer and the second buffer layer comprise different buffer materials or are formed at different temperatures.

5. The semiconductor device of claim 4, wherein one buffer material is AlN and the other buffer material is AlGaN.

6. The semiconductor device of claim 1, wherein the buffer material of the buffer layer is configured to match to the crystal lattices of the silicon substrate and one of the III-V nitride layers.

7. The semiconductor device of claim 1, wherein the buffer material is selected from the group consisting of GaN, ZnO, AlN, HfN, As, SiCN, TaN, and SiC.

8. The semiconductor device of claim 1, wherein the buffer layer has a thickness in the range of 1 to 1000 Angstroms.

9. The semiconductor device of claim 1, wherein one III-V nitride layer is formed of n-doped GaN and the other III-V nitride layer is formed of p-doped GaN.

10. The semiconductor device of claim 1, wherein the quantum-well layer is a material selected from the group consisting of InN and InGaN.

11. The semiconductor device of claim 1, wherein the quantum-well layer comprises a layer of a material selected from the group consisting of GaN and AlGaN.

12. The semiconductor device of claim 1, further comprising:
a first electrode on one III-V nitride layer; and
a second electrode on the other III-V nitride layer.

13. The semiconductor device of claim 12, wherein the second electrode comprises a transparent electrically conductive material.

14. The semiconductor device of claim 1, wherein the buffer material is AlGaN.

15. The semiconductor device of claim 1, wherein the first [111] surface comprises a trench formed in the substrate.

16. A semiconductor device, comprising:
a silicon substrate having a substrate surface in the (100) direction;
a trench having a trench surface in the (111) direction;
a buffer layer of buffer material on the trench surface, the substrate surface being substantially free of buffer material;
a first III-V nitride layer on the buffer layer;
a quantum-well layer on the first III-V nitride layer, wherein the quantum-well layer is configured to emit light when an electric current is produced in the quantum-well layer; and
a second III-V nitride layer on the quantum-well layer.

17. The semiconductor device of claim 16, further comprising:
a first electrode on the first III-V nitride layer and
a transparent second electrode on the second III-V nitride layer.

18. The semiconductor device of claim 16, wherein the buffer material is selected from the group consisting of GaN, ZnO, AlN, HfN, AlAs, SiCN, TaN, and SiC.

19. The semiconductor device of claim 16, wherein the quantum-well layer comprises a material selected from the group consisting of InN and InGaN.

20. The semiconductor device of claim 16, wherein the quantum-well layer comprises a material selected from the group consisting of GaN and AlGaN.

21. The semiconductor device of claim 16, wherein the first III-V nitride layer is formed of n-doped GaN and the second III-V nitride layer is formed of p-doped GaN.

22. The semiconductor device of claim 16, wherein the first III-V nitride layer is formed of p-doped GaN and the second III-V nitride layer is formed of n-doped GaN.

* * * * *